US006666958B1

United States Patent
Yoshikawa et al.

(10) Patent No.: US 6,666,958 B1
(45) Date of Patent: *Dec. 23, 2003

(54) METHOD FOR CONTROLLING A REFRACTIVE INDEX OF A DRY PLATING FILM AND METHOD FOR MAKING A DRY PLATING BUILT-UP FILM (75) Inventors: Masato Yoshikawa, Kodaira (JP); Shingo Ohno, Kodaira (JP); Sho Kumagai, Kodaira (JP)

(73) Assignee: Bridgestone Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/407,703

(22) Filed: Sep. 28, 1999

(30) Foreign Application Priority Data

Sep. 28, 1998  (JP) .......................................... 10-290047
Sep. 28, 1998  (JP) .......................................... 10-290048
Sep. 28, 1998  (JP) .......................................... 10-290049
Sep. 28, 1998  (JP) .......................................... 10-290050

(51) Int. Cl.$^7$ .......................... C23C 14/06; C23C 14/34; C23C 16/30; C23C 16/24
(52) U.S. Cl. ............................. 204/192.23; 204/192.15; 204/192.16; 204/192.26; 204/192.27; 204/298.13; 264/123; 264/125; 427/249.15
(58) Field of Search .......... 204/192.23, 192.15–192.16, 204/192.26–192.27, 192.12, 298.13; 264/123–125; 427/249.15

(56) References Cited

U.S. PATENT DOCUMENTS

| 4,517,217 | A |   | 5/1985 | Hoffman |            |
|-----------|---|---|--------|---------|------------|
| 4,846,541 | A | * | 7/1989 | Miura et al. | 204/192.29 |
| 5,346,600 | A | * | 9/1994 | Nieh et al.  | 204/192.16 |
| 5,741,403 | A | * | 4/1998 | Tenhover et al. | 204/192.15 |
| 5,944,963 | A | * | 8/1999 | Ruppel et al. | 204/192.23 |

FOREIGN PATENT DOCUMENTS

WO    WO 95/20060    7/1995

OTHER PUBLICATIONS

Misaki H. et al., "Hydrogen–Containing Sien Protective Films For Magneto–Optical Media", vol. 25, NR. 5, pp. 4030–4032, XP000069274.

Lu W–J et al., "Thermal Oxidation of Sputtered Silicon Carbide Thin Films", vol. 131, No. 8, Aug. 1984, pp. 1904–1914, XP000840256.

* cited by examiner

*Primary Examiner*—Mark F. Huff
*Assistant Examiner*—Daborah Chacko Davis
(74) *Attorney, Agent, or Firm*—Sughrue Mion, PLLC (57) ABSTRACT

A method for making a dry plating built-up film comprises providing silicon carbide as a starting source and subjecting to dry plating while changing a concentration of a reactive gas continuously or intermittently to deposit and form, on a substrate, a thin film having different refractive indices along its thickness. A method for making a sputter built-up film is also described, which comprising providing silicon carbide as a target and subjecting to sputtering while changing making electric power against the target continuously or intermittently to deposit and form a thin film having different refractive indices along its thickness.

5 Claims, 7 Drawing Sheets

METHOD FOR CONTROLLING A REFRACTIVE INDEX OF A DRY PLATING FILM AND METHOD FOR MAKING A DRY PLATING BUILT-UP FILM

BACKGROUND OF THE INVENTION

This invention relates to a method for controlling a refractive index of a dry plating film wherein a thin film having a desired refractive index can be reliably made according to a dry plating process. The invention also relates to a method for making a dry plating built-up film wherein thin films having different refractive indices are built up along the thickness thereof to provide a built-up film suited for use as an optical filter or the like.

Where a desired refractive index is obtained, usual practice is to use an oxide film. However, with an oxide film, a refractive index does not change significantly by changing a ratio of oxygen in the oxide film. This places a limit on the value of refractive index. In addition, it is difficult to obtain a built-up film whose refractive index is arbitrarily changed as required.

SUMMARY OF THE INVENTION

A first object of the invention is to provide a method for controlling a refractive index of a dry plating film wherein a thin film having a refractive index ranging from 1.4 to 2.8 can be reliably made according to a dry plating process.

A second object of the invention is to provide a method for simply, reliably making a dry plating built-up film whose refractive index can be arbitrarily changed along its thickness.

The inventors made intensive studies in order to achieve the above objects, and as a result, found that when using silicon carbide (SiC) as a target in a sputtering process or as an evaporation source in a vacuum evaporation process and changing the concentration of a reactive gas such as oxygen gas or nitrogen gas, there can be formed a thin film made primarily of SiC wherein the content of carbon is controlled to provide an arbitrary refractive index in the range of 1.4 to 2.8 (on measurement at 25° C.) depending on the concentration.

According to one embodiment of the invention, there is provided a method for controlling a refractive index of a dry plating film which comprises providing silicon carbide as a starting source and subjecting the silicon carbide to dry plating while controlling a concentration of a reactive gas, thereby forming a thin film, on a substrate, made primarily of silicon carbide and having a refractive index ranging from 1.4 to 2.8.

The inventors also found that when using silicon carbide (SiC) as a target in a sputtering process and changing making electric power against the target, a thin film having an arbitrary refractive index in the range of 1.4 to 2.8 (on measurement at 25° C.) depending on the making electric power can be formed. In this case, when sputtering is carried out while changing the concentration of a reactive gas, such as oxygen or nitrogen gas, there can be more effectively formed a thin film made primarily of SiC and having an arbitrary refractive index.

Thus, according to the second embodiment of the invention, there is provided a method for controlling a refractive index of a sputter film, which comprises providing silicon carbide as a target, and subjecting the silicon carbide to sputtering while controlling electric power charged against a target, thereby forming, on a substrate, a thin film made primarily of silicon carbide which has a refractive index ranging from 1.4 to 2.8.

It has also been found that when dry plating is effected in the first embodiment while changing the concentration of the reactive gas continuously or intermittently, the resultant dry plating film has a refractive index which is changed in the form of a wave form, such as a rectangular wave, triangular form, sine wave form or the like, along the thickness thereof. Likewise, when sputtering is effected in the second embodiment while changing the electric power against the target continuously or intermittently and, optionally, changing the concentration of a reactive gas continuously or intermittently, the resultant sputtering film has a refractive index which changes in a wave form such as a rectangular, triangular, sine wave or the like form along the thickness thereof. If the film is used as a filter capable of passing an arbitrary band, a built-up film, which is useful as an anti-reflective film such as a visible light anti-reflective film or the like, can be simply formed.

Hence, according to a third embodiment of the invention, there is provided a method for making a dry plating built-up film, which comprises providing silicon carbide as a starting source, and subjecting the silicon carbide to dry plating while changing a concentration of a reactive gas continuously or intermittently, thereby depositing and forming a thin film having different refractive indices along its thickness.

According to a fourth embodiment of the invention, there is provided a method for making a sputter built-up film which comprises providing silicon carbide as a target, and subjecting the silicon carbide to sputtering while changing making electric power against the target continuously or intermittently, thereby depositing and forming a thin film having different refractive indices along its thickness.

DETAILED DESCRIPTION OF THE INVENTION

In the method for controlling a refractive index of a dry plating film and the method for making a dry plating built-up film according to the invention, silicon carbide is provided as a starting source or target and dry-plated on a substrate.

As the dry plating process, there may be used various types of dry plating processes including a sputtering process, a reactive vacuum evaporation process, an ion plating process and the like, and thus, any known ordinary processes may be adopted except that dry plating is carried out in an atmosphere of reactive gases as described hereinafter. Of these dry plating processes, a sputtering process is preferably used.

Although depending on the electric conductivity of a SiC target used, there may be used high frequency sputtering, high frequency magnetron sputtering and the like processes when the electric conductivity is low, and DC sputtering, DC magnetron sputtering and the like processes when the electric conductivity is high. When using a SiC target material which is made of a silicon carbide sintered product and is electrically conductive, DC sputtering and DC magnetron sputtering are preferred.

It will be noted that there may be used, as a substrate, inorganic materials such as glass, ceramics and the like, metal materials, and organic materials such as PMMA, PET and the like.

Silicon carbide is used as a target when a sputtering process is adopted and as an evaporation source when a vacuum evaporation process is used and also as an evaporation source in the case of an ion plating process.

Silicon carbide should preferably be one which is formed as a silicon carbide sintered product obtained by sintering a mixture having a density of 2.9 g/cm$^3$ or over and formed by homogeneously mixing silicon carbide powder and a non-metallic sintering aid. In this case, the total content of impurities contained in the silicon carbide sintered product should preferably be not higher than 1 ppm. The non-metallic sintering aids include organic compounds capable of producing carbon by heating such as, for example, coal tar pitch, phenolic resins, furan resins, epoxy resins, glucose, sucrose, cellulose, starch and the like. Of these, phenolic resins are preferred. The non-metallic sintering aid should favorably cover the surfaces of silicon carbide powder therewith. The silicon carbide sintered product can be obtained by hot pressing the mixture in a non-oxidative atmosphere.

The silicon carbide powder used for the preparation of the silicon carbide sintered product should preferably be one which is obtained by the following procedure. The procedure comprises the steps of solidifying a mixture obtained by mixing a silicon source containing at least one liquid silicon compound, a carbon source containing at least one liquid organic compound capable of producing carbon by heating, and a catalyst for polymerization or crosslinkage, thermally carbonizing the resultant solid matter in a non-oxidative atmosphere, and sintering the matter further in a non-oxidative atmosphere.

The silicon carbide sintered product makes use, as a sintering aid, of a non-metallic sintering aid alone at the time of sintering silicon carbide powder without use of a metallic sintering aid including a metal such as boron, aluminium, berylium or the like or compounds thereof, or without a carbon sintering aid such as carbon black, graphite or the like. Accordingly, the sintered product has a high purity with a reduced amount of foreign matter existing at grain boundaries, and has good thermal conductivity and is inherently better in stain resistance and abrasion resistance than carbon materials. Thus, the silicon carbide is able to form a thin film adapted for use as a protective film or a functional film of various types of electronic device parts and also as a thin film for surface treatment useful in improving the durability of various types of tools.

Accordingly, it is preferred that, in the practice of the invention, the above silicon carbide sintered product is used as a target or an evaporation source.

In the present invention, the control of a refractive index is realized by performing dry plating in a reactive gas atmosphere wherein the concentration of a reactive gas is appropriately controlled (or selected). In the case where a dry plating built-up film having different refractive indexes along the thickness thereof is formed, the dry plating is carried out in a reactive gas atmosphere while changing the concentration of the reactive gas continuously or intermittently.

The reactive gases are not critical in type unless they are inert gases, and include oxygen-containing gases such as oxygen gas, carbon monoxide gas, carbon dioxide gas and like, and nitrogen-containing gases such as nitrogen gas, nitrogen monoxide gas, nitrogen dioxide gas, ammonia gas and the like. These gases may be used singly or in admixture, and oxygen-containing gases and nitrogen-containing gases may be mixed together. If these reactive gases alone are passed into a vacuum chamber, it is preferred to control their concentration within a range of 0 to 100 ml/minute although depending on the capacity of the vacuum chamber. A ratio of the reactive gas to an inert gas (i.e. flow rate of reactive gas/(flow rate of reactive gas+flow rate of inert gas)×100) is preferably within a range of 0 to 50%.

It will be noted that if a sputtering process is adopted, making electric power may vary depending on the size of a target and can be within a range of 50 to 2000 W for a target size of 100 mm$\phi$, and within a range of 0.5 to 30 W/cm$^2$ when expressed in terms of a making electric power density in target.

The concentration (flow rate) of the reactive gas may be changed continuously or at appropriate intervals of time and is controlled in accordance with a required variation in refractive index. In this way, a film may be obtained whose refractive index is changed, along its thickness, in a desired wave form such as a rectangular, triangular or sine wave.

On the other hand, when sputtering is performed using silicon carbide as a target, an arbitrary refractive index can be imparted to the resultant thin film by appropriately controlling (or selecting) making electric power against the target. When the sputtering is carried out while changing the making electric power against the target continuously or intermittently, a sputter built-up film can be obtained whose refractive index changes along the thickness of the film. In the case, although depending on the size of a target, the making electric power is within a range of 50 to 2000 W for a size of 100 mmφ and also within a range of 0.5 to 30 W/cm² when expressed in terms of making electric power density in target.

The sputtering may be effected in an atmosphere of an inert gas such as argon or the like. Although depending on the capacities of a vacuum chamber, a vacuum pump and the like, the flow rate of an inert gas ranges, for example, from 5 to 30 ml/minute, preferably from 10 to 25 ml/minute. In the practice of the invention, a reactive gas may be further incorporated, and when the sputtering is effected while changing the concentration of a reactive gas continuously or intermittently, the refractive index of the resultant thin film can be conveniently controlled. In this case, the reactive gas is not critical with respect to the type thereof provided that it does not consist of an inert gas, and includes oxygen-containing gases such as oxygen gas, carbon monoxide gas, carbon dioxide gas and the like, nitrogen-containing gases such as nitrogen gas, nitrogen monoxide gas, nitrogen dioxide gas, ammonia gas and the like. These gases may be used singly or in admixture, and oxygen-containing gases and nitrogen-containing gases may be used after mixing. Where these reactive gases alone are passed to a vacuum chamber, their concentration should preferably be controlled within a range of 0 to 100 ml/minute for an apparatus used in the present invention although such a range differs depending on the capacities of a vacuum chamber and a vacuum pump. It is also preferred that a ratio of the reactive gas to an inert gas (i.e. flow rate of reactive gas/(flow rate of reactive gas+flow rate of inert gas)×100) is within a range of 0 to 50%.

Other sputtering conditions may be those which are ordinarily employed in this art.

The change in making electric power against a target, and the change in concentration (flow rate) of a reactive gas, which is initiated, if necessary, may be effected continuously or at appropriate intervals of time and is controlled depending on the required change in refractive index. In this manner, a film whose refractive index is changed in a desired wave form, such as a rectangular wave, triangular wave or sine wave form, along a thickness thereof can be obtained.

The thickness of the dry plating film or sputter film is appropriately selected and is generally in the range of 1 nm to 100 μm, preferably 5 nm to 10 μm.

The dry plating film or sputter film consists of a film of $SiC_xO_y$ alone (x and y are, respectively, an arbitrary number) or a film of a mixture of SiC, SiO, $SiO_2$ and $SiC_xO_y$ when the reactive gas used is oxygen gas, and a film of $SiC_xN_y$ alone (x and y are, respectively, an arbitrary number) or a film of a mixture of SiC, $Si_3N_4$, SiN and $SiC_xN_y$ when the reactive gas used is nitrogen gas. The content of carbon is controlled depending on the concentration of these reactive gases, and a thin film which is primarily made of SiC and whose refractive index is arbitrarily changed along the depth thereof within a range of 1.4 to 2.8, preferably 1.46 to 2.67 can be obtained.

The thin film has a refractive index distribution ranging from 1.4 to 2.8 along the depth thereof, and thus, is capable of forming an optical filter which has a high transmittance or a high reflectance within a certain range of wavelength. In addition, the film also has toughness inherent to SiC and can provide a hard coat film which is excellent in abrasion resistance and mar proofing, thus being useful as anti-reflective films, various types of optical filters, transparent, abrasion-resistant films, half mirror films and the like.

EXAMPLE

The invention is more particularly described by way of examples, which should not be construed as limiting the invention thereto.

Example 1

Sputtering was carried out under the following conditions to form thin films having different refractive indices.
Sputtering apparatus: DC magnetron sputtering apparatus
Substrate: glass sheet
Target material: SiC
Target size: 100 mmφ
Feed gases: argon gas, 18 ml/minute oxygen gas, flow rates indicated in Table 1
Pressure: 5 mTorr.
Supplied electric power: 500 W
Film-forming time: 10 minutes
Measurement of film thickness: contact type film thickness meter (made by Talor Bobson Inc.)
Measurement of refractive index: Ellipsometry (Nippon Bunko K.K.)
(wavelength for measurement: 800 nm)

TABLE 1

| Flow rate of argon gas | Flow rate of oxygen gas | Making electric power | Refractive index | Film-forming rate (Å/min) |
|---|---|---|---|---|
| 18 ml/min | 0 ml/min | 500 W | 2.00 | 820 |
| 18 ml/min | 0.2 ml/min | 500 W | 2.00 | 850 |
| 18 ml/min | 1 ml/min | 500 W | 1.79 | 1100 |
| 18 ml/min | 2 ml/min | 500 W | 1.58 | 1280 |

Example 2

Sputtering was performed in the same manner as in Example 1 except that the making electric power was set at 1000 W, thereby forming thin films having different refractive indices indicated in Table 2.

TABLE 2

| Flow rate of argon gas | Flow rate of oxygen gas | Making electric power | Refractive index | Film-forming rate (Å/min) |
|---|---|---|---|---|
| 18 ml/min | 0 ml/min | 1000 W | 2.67 | 1500 |
| 18 ml/min | 1 ml/min | 1000 W | 2.32 | 1700 |
| 18 ml/min | 2 ml/min | 1000 W | 2.15 | 1850 |
| 18 ml/min | 5 ml/min | 1000 W | 1.73 | 2600 |

Example 3

Sputtering was performed in the same manner as in Example 1 except that nitrogen gas was used as a reactive gas in place of oxygen gas and the making electric power was set at 1000, thereby forming thin films having different refractive indices indicated in Table 3.

TABLE 3

| Flow rate of argon gas | Flow rate of oxygen gas | Making electric power | Refractive index | Film-forming rate (Å/min) |
|---|---|---|---|---|
| 18 ml/min | 0 ml/min | 1000 W | 2.67 | 1500 |
| 18 ml/min | 0.2 ml/min | 1000 W | 2.62 | 1510 |
| 18 ml/min | 0.5 ml/min | 1000 W | 2.53 | 1660 |
| 18 ml/min | 1 ml/min | 1000 W | 2.52 | 1600 |
| 18 ml/min | 2 ml/min | 1000 W | 2.39 | 1650 |
| 18 ml/min | 5 ml/min | 1000 W | 2.09 | 2000 |

Example 4

Reactive vacuum evaporation was conducted under the following conditions to form thin films having different refractive indices. The results are shown in Table 4.

Vacuum evaporation apparatus: electron beam vacuum evaporation apparatus
Substrate: glass sheet
Evaporation source: SiC
Feed gas: oxygen gas, 10 ml/minute
Making electric power against ion source: 500 W
Pressure: 3×10$^{-5}$ Torr.
Film-forming time: 1 minute

TABLE 4

| Making electric power | Refractive index | Film-forming rate (Å/min) |
|---|---|---|
| 500 W | 1.65 | 1350 |
| 1000 W | 2.10 | 2430 |
| 2000 W | 2.60 | 4500 |

The results of these examples revealed that when the concentration (or flow rate) of a reactive gas (i.e. oxygen or nitrogen gas) was appropriately controlled, there could be obtained thin films having different refractive indices.

Example 5

Figure 1:
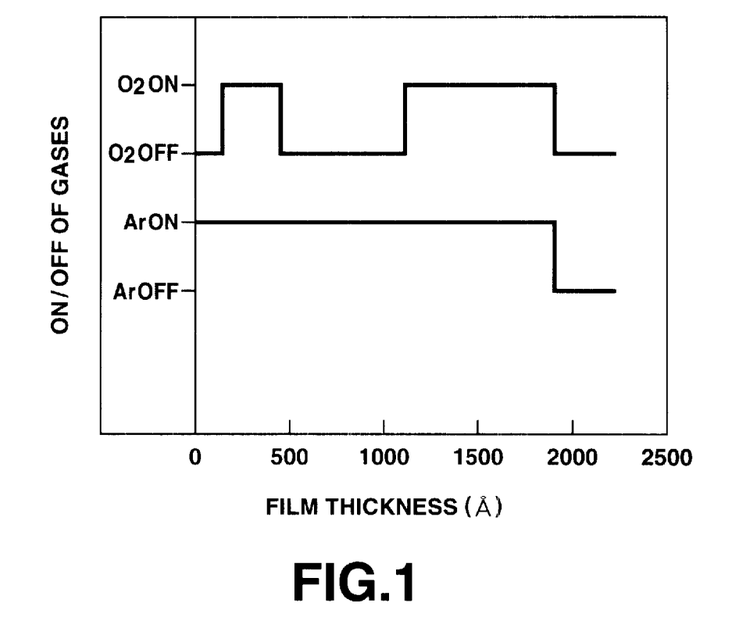
FIG. 1 is a graph showing the manner of feed (along a film thickness) of argon and oxygen gases in relation to the variation in time in Example 5.
Figure 2:
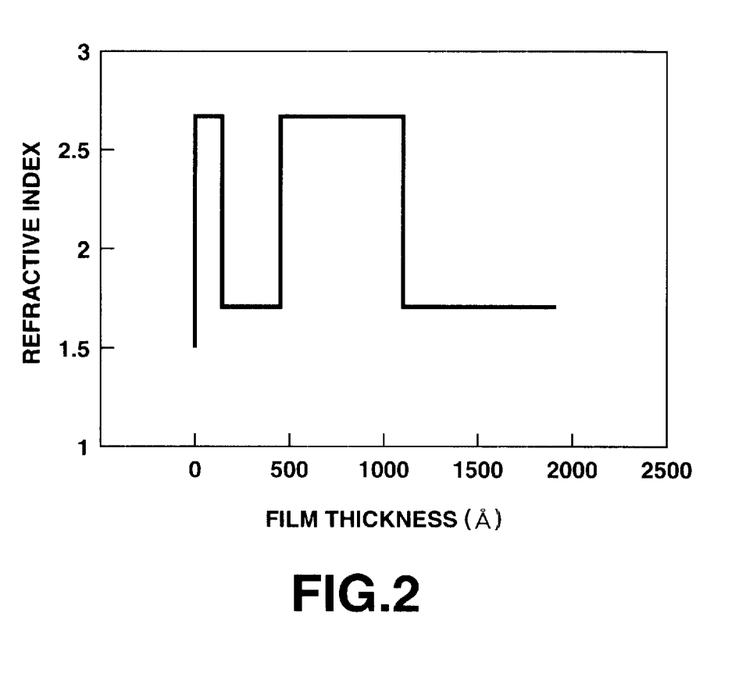
FIG. 2 is a graph showing the variation in refractive index along a thickness of a built-up film obtained in the above example.

The general procedure of Example 1 was repeated except that sputtering was performed such that an argon gas was continuously fed at a rate of 18 ml/minute while the feed of oxygen gas was turned on or off in a manner as shown in FIG. 1 (with the feed being at 5 ml/minute when the oxygen gas was fed). The resultant film had a change in refractive index as shown in FIG. 2.

Example 6

Figure 3:
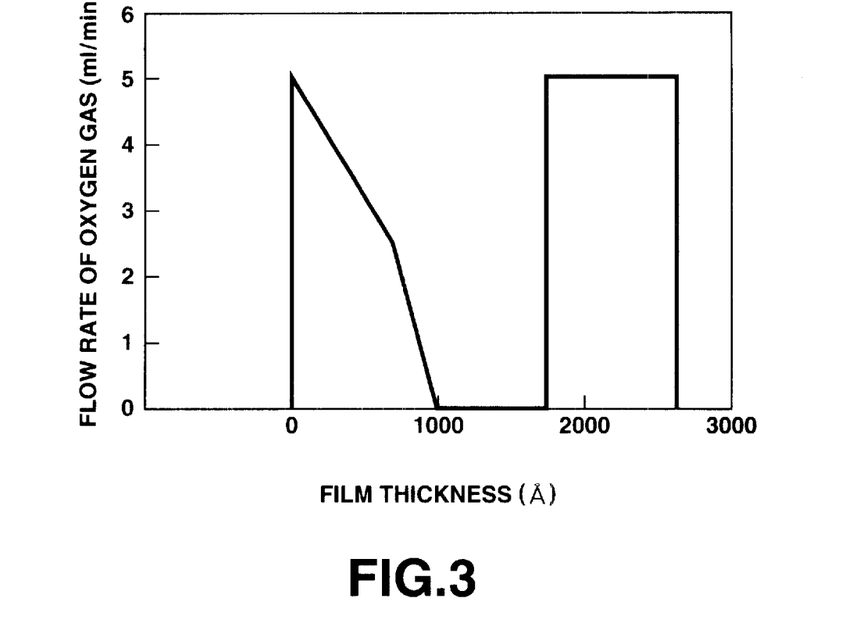
FIG. 3 is a graph showing the manner of feed of oxygen gas in relation to the variation in time in Example 6.
Figure 4:
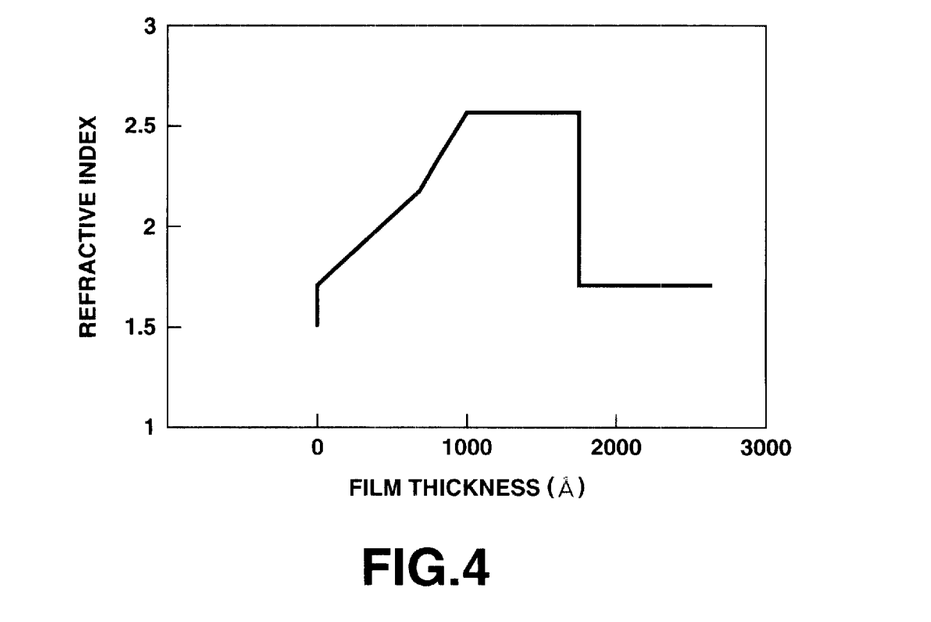
FIG. 4 is a graph showing the variation in refractive index along a thickness of a built-up film obtained in Example 6.

Sputtering was effected while changing a flow rate of oxygen gas as shown in FIG. 3. The refractive index of the resultant film is shown in FIG. 4.

Example 7

Figure 5:
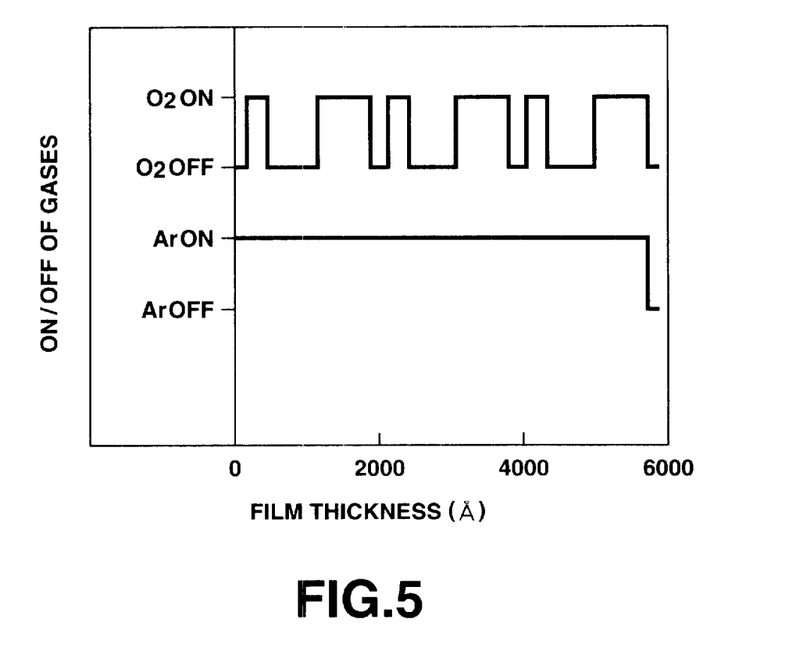
FIG. 5 is a graph showing the manner of feed of argon and oxygen gases in relation to the variation in time in Example 7.
Figure 6:
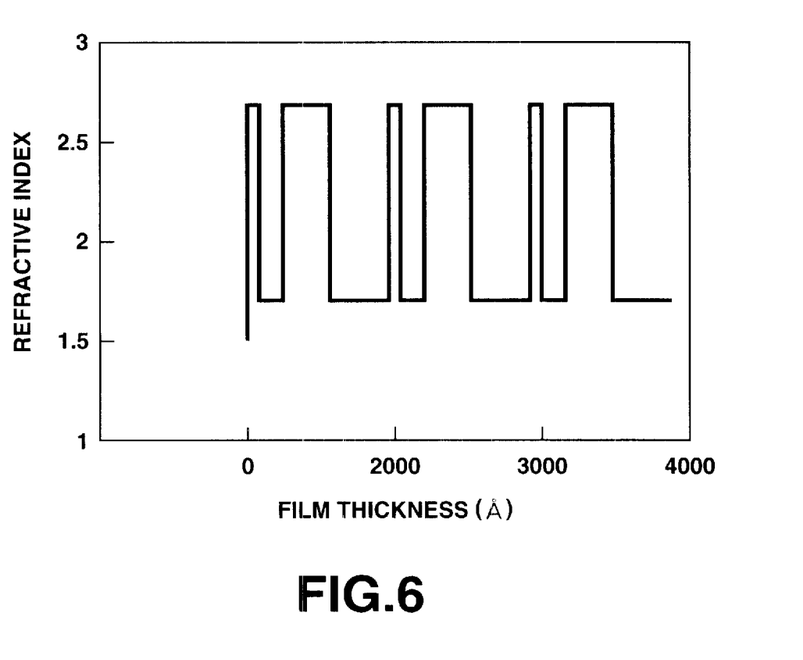
FIG. 6 is a graph showing the variation in refractive index along a thickness of a built-up film obtained in Example 7.

Sputtering was effected while changing a flow rate of oxygen gas as shown in FIG. 5. The refractive index of the resultant film is shown in FIG. 6.

Example 8

Figure 7:
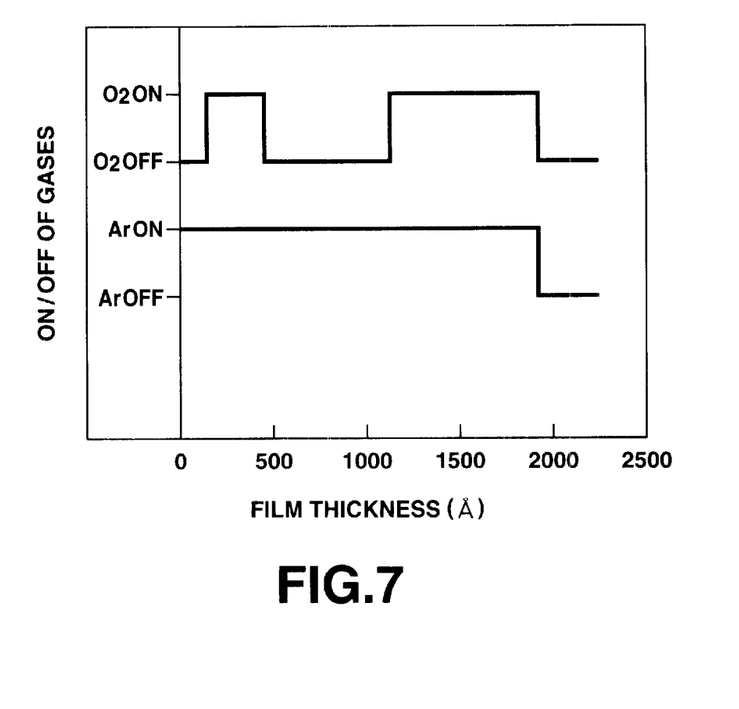
FIG. 7 is a graph showing the manner of feed of argon and oxygen gases in relation to the variation in time in Example 8.
Figure 8:
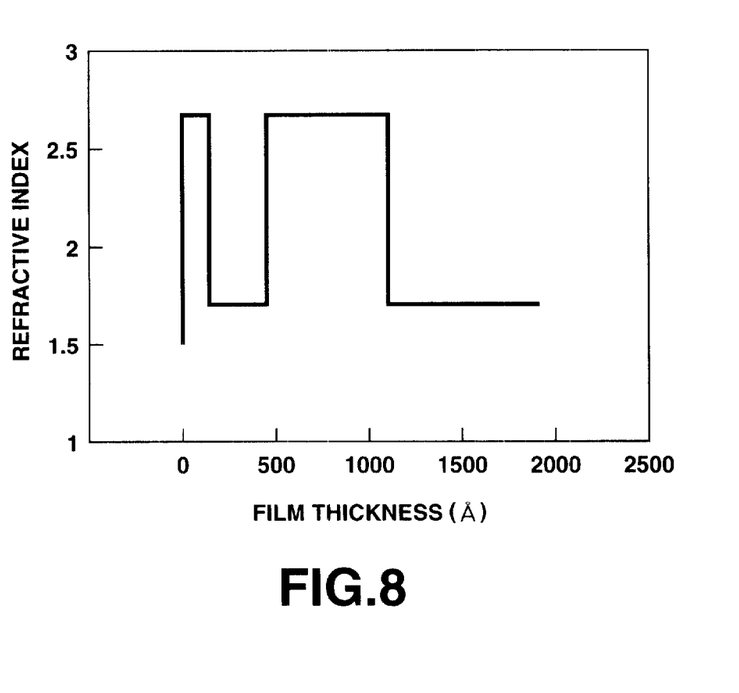
FIG. 8 is a graph showing the variation in refractive index along a thickness of a built-up film obtained in Example 8.

Reactive vacuum deposition was effected under the following conditions.
Vacuum evaporation apparatus: electron beam vacuum evaporation apparatus
Substrate: glass sheet
Evaporation source: SiC
Making electric power against ion source: 500 W
Pressure: 3×10$^{-5}$ Torr.
Film-forming time: 1 minute
Sputtering was effected while changing a flow rate of oxygen gas as shown in FIG. 7. The resultant film had a refractive index shown in FIG. 8.

As will be apparent from the foregoing, there can be reliably formed built-up films which had an arbitrary change in refractive index within a range of 1.4 to 2.8 along a thickness thereof.

Example 9

Sputtering was effected under the following conditions to form thin films having different refractive indices.
Sputtering apparatus: DC magnetron sputtering apparatus
Substrate: glass sheet
Target material: SiC
Target size: 100 mmφ
Feed gases: argon gas, 18 ml/minute oxygen gas, flow rates indicated in Tables 5 to 7
Pressure: 5 mTorr.
Supplied electric power: making powers indicated in Tables 5 to 7
Film-forming time: 10 minutes
Measurement of film thickness: contact type film thickness meter (made by Talor Bobson Inc.)
Measurement of refractive index: Ellipsometry (Nippon Bunko K.K.)
(wavelength for measurement: 800 nm)

TABLE 5

| Flow rate of argon gas | Flow rate of oxygen gas | Making electric power | Refractive index | Film-forming rate (Å/min) |
|---|---|---|---|---|
| 18 ml/min | 0 ml/min | 100 W | 1.62 | 200 |
| 18 ml/min | 0 ml/min | 300 W | 1.85 | 580 |
| 18 ml/min | 0 ml/min | 500 W | 2.00 | 820 |
| 18 ml/min | 0 ml/min | 700 W | 2.25 | 1150 |
| 18 ml/min | 0 ml/min | 1000 W | 2.67 | 1500 |

TABLE 6

| Flow rate of argon gas | Flow rate of oxygen gas | Making electric power | Refractive index | Film-forming rate (Å/min) |
|---|---|---|---|---|
| 18 ml/min | 0 ml/min | 500 W | 2.00 | 820 |
| 18 ml/min | 0.2 ml/min | 500 W | 2.00 | 850 |
| 18 ml/min | 1 ml/min | 500 W | 1.79 | 1100 |
| 18 ml/min | 2 ml/min | 500 W | 1.58 | 1280 |

TABLE 7

| Flow rate of argon gas | Flow rate of oxygen gas | Making electric power | Refractive index | Film-forming rate (Å/min) |
|---|---|---|---|---|
| 18 ml/min | 0 ml/min | 1000 W | 2.67 | 1500 |
| 18 ml/min | 1 ml/min | 1000 W | 2.32 | 1700 |
| 18 ml/min | 2 ml/min | 1000 W | 2.15 | 1850 |
| 18 ml/min | 5 ml/min | 1000 W | 1.73 | 2600 |

Example 10

Sputtering was effected in the same manner as in Example 9 except that nitrogen gas was used, as a reactive gas, in place of oxygen gas (at flow rates indicated in Table 8) and the making electric power was set at 1000 W, thereby obtaining thin films having different refractive indices shown in Table 8.

TABLE 8

| Flow rate of argon gas | Flow rate of oxygen gas | Making electric power | Refractive index | Film-forming rate (Å/min) |
|---|---|---|---|---|
| 18 ml/min | 0 ml/min | 1000 W | 2.67 | 1500 |
| 18 ml/min | 0.2 ml/min | 1000 W | 2.62 | 1510 |
| 18 ml/min | 0.5 ml/min | 1000 W | 2.53 | 1660 |
| 18 ml/min | 1 ml/min | 1000 W | 2.52 | 1600 |
| 18 ml/min | 2 ml/min | 1000 W | 2.39 | 1650 |
| 18 ml/min | 5 ml/min | 1000 W | 2.09 | 2000 |

The results of the above examples reveal that there can be obtained thin films having different refractive indices by controlling the making electric power against the target and further by controlling the concentration (flow rate) of the reactive gas (oxygen or nitrogen gas).

Example 11

Figure 9:
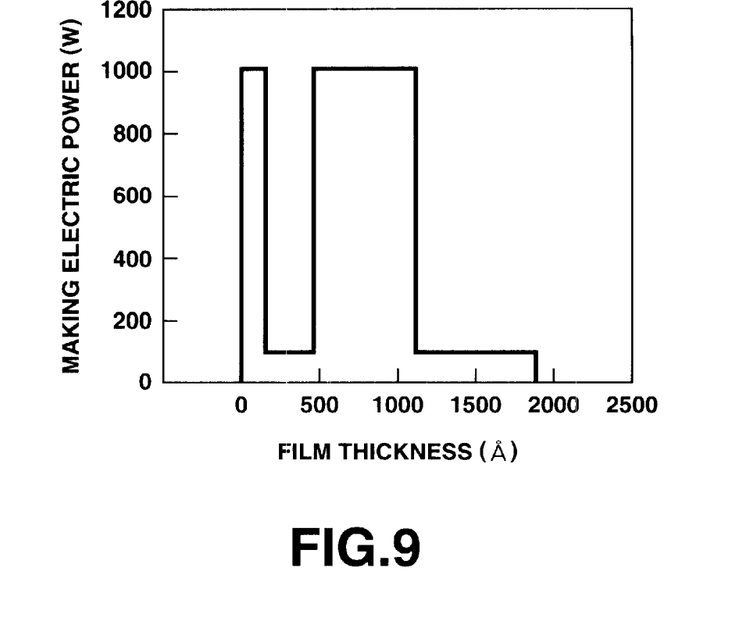
FIG. 9 is a graph showing the variation in making electric power in relation to the variation in time or along a film thickness in Example 11.
Figure 10:
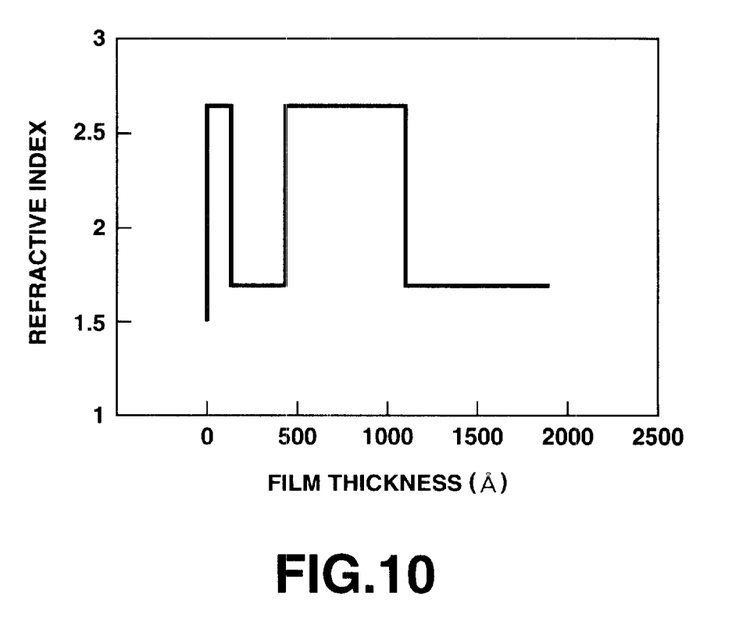
FIG. 10 is a graph showing the variation in refractive index along a thickness of the built-up film obtained in Example 11.

Sputtering was effected in the same manner as in Example 10 except that while continuously passing argon gas at a flow rate of 18 ml/minute and oxygen gas at a flow rate of 5 ml/minute, the supplied electric power against the target was changed as shown in FIG. 9. The resultant film had such a variation in refractive index as shown in FIG. 10.

Example 12

Figure 11:
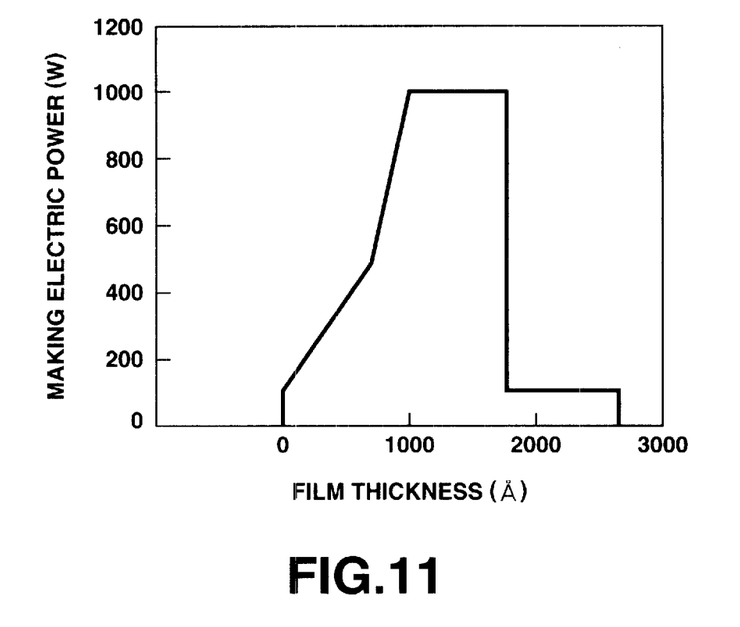
FIG. 11 is a graph showing the variation in making electric power in relation to the variation in time in Example 12.
Figure 12:
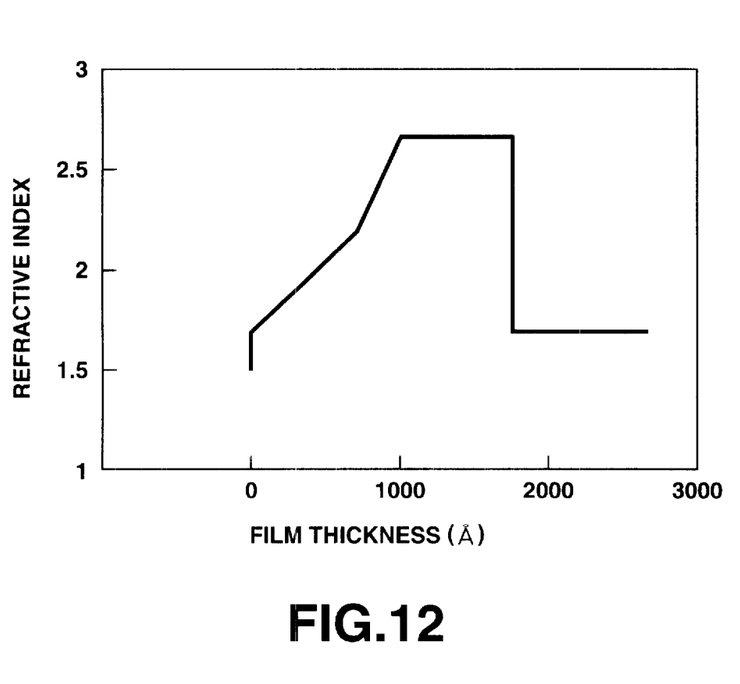
FIG. 12 is a graph showing the variation in refractive index along a thickness of the built-up film obtained in Example 12.

Sputtering was effected while changing supplied electric power in a manner as shown in FIG. 11. The resultant film had a variation in refractive index as shown in FIG. 12.

Example 13

Figure 13:
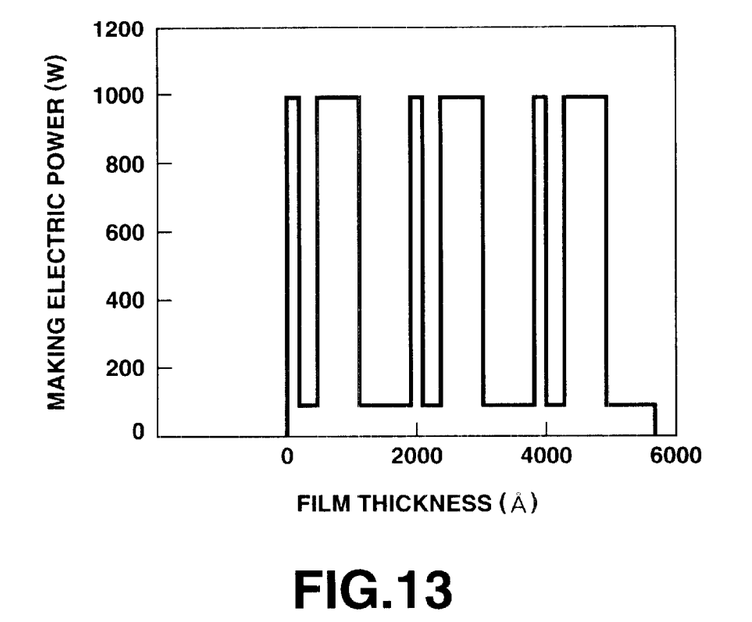
FIG. 13 is a graph showing the variation in making electric power in relation to the variation in time in Example 13.
Figure 14:
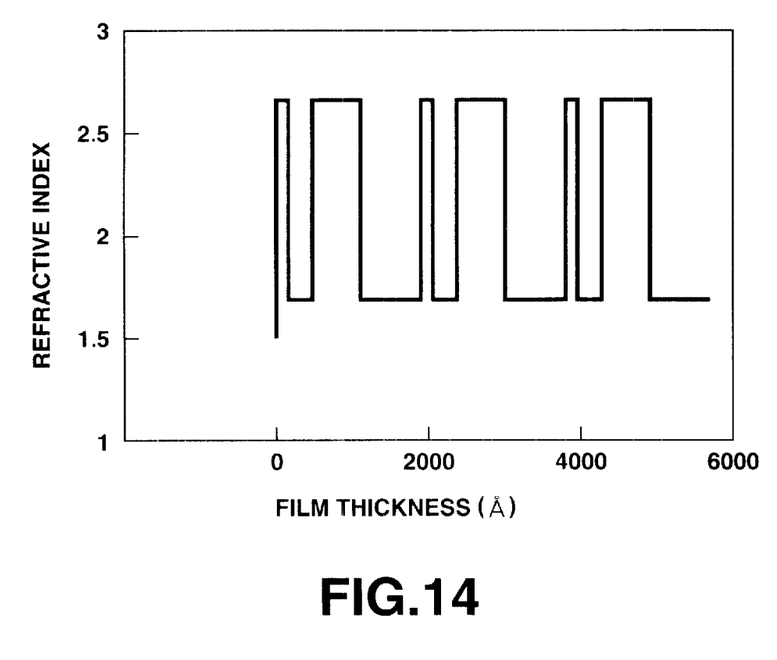
FIG. 14 is a graph showing the variation in refractive index along a thickness of the built-up film obtained in Example 13.

Sputtering was effected while changing supplied electric power in a manner as shown in FIG. 13. The resultant film had a variation in refractive index as shown in FIG. 14.

As will be apparent from the above examples, there can be reliably formed built-up films whose refractive indices are arbitrarily changed within a range of 1.4 to 2.8 along a thickness thereof.

What is claimed is:

1. A method for making a sputter built-up film which comprises the steps of providing silicon carbide as a target, and subjecting the silicon carbide to sputtering while changing electric power against the target continuously, thereby depositing and forming, on a substrate, a thin film having different refractive indices along its thickness.

2. A method according to claim 1, further comprising changing a concentration of a reactive gas continuously or intermittently.

3. A method according to claim 1, wherein said silicon carbide used as the starting source consists essentially of a silicon carbide sintered product which is obtained by sintering a homogeneous mixture having a density of 2.9 g/cm$^3$ or over and made of silicon carbide powder and a non-metallic sintering aid.

4. A method according to claim 1, wherein said built-up film is used as an anti-reflective film.

5. A method according to claim 1, wherein the sputter build-up film has a refractive index which changes in a wave form selected from a rectangular wave, triangular wave and sine wave along the thickness thereof.

* * * * *